United States Patent [19]

Satoh et al.

[11] Patent Number: 5,073,946

[45] **Date of Patent: * Dec. 17, 1991**

[54] THIN SPEAKER HAVING AN ENCLOSURE WITH AN OPEN PORTION AND A CLOSED PORTION

[75] Inventors: Katsuaki Satoh, Osaka; Kazue Sato, Neyagawa; Kousaku Murata, Kobe; Tsuneo Tanaka, Nishinomiya; Shuji Saiki; Satoshi Takayama, both of Hirakata; Hiroyuki Takewa, Kaizuka; Mitsuhiko Serikawa; Seiichi Ishikawa, both of Hirakata; Sawako Usuki, Kobe; Yoichi Kimura, Ashiya; Shuichi Obata, Kyoto, all of Japan

[73] Assignee: Matsushita Electric Industrial Co., Ltd., Osaka, Japan

[ * ] Notice: The portion of the term of this patent subsequent to Feb. 6, 2007 has been disclaimed.

[21] Appl. No.: 441,918

[22] Filed: Nov. 28, 1989

Related U.S. Application Data

[63] Continuation-in-part of Ser. No. 96,528, Sep. 15, 1987, Pat. No. 4,899,390.

[30] Foreign Application Priority Data

| | | | |
|---|---|---|---|
| Sep. 19, 1986 | [JP] | Japan | 61-223149 |
| Oct. 20, 1986 | [JP] | Japan | 61-248726 |
| Nov. 27, 1986 | [JP] | Japan | 61-282501 |
| Dec. 19, 1986 | [JP] | Japan | 61-304326 |
| Apr. 1, 1987 | [JP] | Japan | 62-80015 |
| Apr. 20, 1987 | [JP] | Japan | 62-96502 |

[51] Int. Cl.⁵ .......................... H04R 25/00; H04R 7/00; H05K 5/00

[52] U.S. Cl. .......................... 381/154; 381/159; 381/186; 381/182; 381/194; 181/145; 181/160

[58] Field of Search .............. 381/154, 159, 152, 184, 381/186, 182, 203, 87, 88, 90, 194; 181/160, 161, 156, 163, 164, 165, 173, 145, 155

[56] References Cited

U.S. PATENT DOCUMENTS

| | | | |
|---|---|---|---|
| 2,632,055 | 3/1953 | Parker | 381/186 |
| 3,204,031 | 8/1965 | Gorike et al. | 381/111 |
| 3,688,864 | 9/1972 | Guss | 381/158 |
| 3,858,679 | 1/1975 | Askins | 181/145 |
| 4,122,302 | 10/1978 | Bobb | 381/159 |
| 4,213,008 | 7/1980 | Helffrich | 181/153 |
| 4,426,556 | 1/1984 | Saiki et al. | 381/158 |
| 4,899,390 | 2/1990 | Takawa et al. | 381/154 |

FOREIGN PATENT DOCUMENTS

| | | | |
|---|---|---|---|
| 0012685 | 1/1984 | Japan | 381/159 |

*Primary Examiner*—James L. Dwyer
*Assistant Examiner*—Jason Chan
*Attorney, Agent, or Firm*—Spencer & Frank

[57] ABSTRACT

A speaker which is thin but which is capable of providing high-fidelity reproduction and ensuring a suitable level of sound pressure even when it is brought close to a wall. A closed chamber is formed behind one part of a disphragm mounted in an enclosure, and an open chamber is formed behind another part of the diaphragm. At least one voice coil driver unit is connected to the diaphragm. The phase difference between sounds radiated from the front and rear surfaces of the diaphragm is increased as large as possible by using an acoustic duct for the sound radiated through the open chamber, thereby minimizing cancellation of sounds and improving the sound pressure level.

10 Claims, 15 Drawing Sheets

THIN SPEAKER HAVING AN ENCLOSURE WITH AN OPEN PORTION AND A CLOSED PORTION

CROSS REFERENCE TO RELATED APPLICATION

The present application is a continuation-in-part of an application Ser. No. 07/096,528, filed Sept. 15th, 1987, now U.S. Pat. No. 4,899,390 which is assigned to the assignee of the present application.

BACKGROUND OF THE INVENTION

1. Field of the Invention

This invention relates to a speaker which is thin but which can provide high-fidelity reproduction.

2. Description of the Related Art

There are great demands for speakers which are thin but can provide high-fidelity reproduction because of their space-saving characteristics. It is not very difficult to make a speaker thinner while maintaining its performance in the middle- and high-ranges of frequencies, above several hundred Hz. However, in the reproduction of low frequencies, below several hundred Hz, it is not possible to ensure an adequate sound pressure level unless the volume velocity of the diaphragm is increased. However, in a speaker system using a closed type enclosure, the stiffness of the enclosure $S_B$ (given by $S_B=\rho_0 C_0^2 S^2/V$, where $\rho_0$ represents the density of air; $C_0$ represents the speed of sound; S represents the area of the diaphragm; and V represents the volume of the enclosure) is increased, so that the lowest resonance frequency $f_{0B}$ (given by $f_{0B}=$ $$\frac{1}{2\pi}\sqrt{(S_B+S_D)/M},$$

where $S_D$ represents the stiffness of the vibration system; and M represents the mass of the vibration system, including additional masses) of the system when the diaphragm is attached to the enclosure is increased; and the sound pressure level in the low-frequency range is thus reduced. To reduce the value of $f_{OB}$, M may be increased or $(S_B+S_D)$ may be reduced. However, if M is increased, the sound pressure level is reduced. Therefore, there is no alternative but to reduce $(S_B+S_D)$. If S is made constant, $f_{OB}$ *cannot* be reduced because $S_B>>S_D$, since V is small in the thin speaker system. If S is reduced, it is necessary to increase the amplitude of the diaphragm in order to maintain a certain volume velocity. This may cause increased distortion.

For these reasons, conventional thin speaker systems are usually provided with rear-opening type enclosures. A system of this type will now be described with reference to FIG. 1. As shown in FIG. 1, a rigid diaphragm 1 is connected to an enclosure 3*f* by an edge suspension member 2. The drive system, etc., are omitted in order to simplify the description. Such a speaker system was mounted on a rigid wall 4, and the axial sound pressure frequency characteristics obtained by varying the distance d between the system and the rigid wall 4 were measured. The results of these measurements are shown in FIG. 2. As is clear from FIG. 2, the sound pressure level in the low-frequency range increases as the distance d increases. This is because a sound A which is radiated from the front surface of the diaphragm and a sound B which is radiated from the rear surface achieve opposite phases at a measuring point P, and so cancel each other, as the speaker system is brought closer to the rigid wall. Therefore, this speaker system cannot ensure a desired reproduction sound pressure level unless it is spaced away from the wall by 50 to 60 cm. This speaker system is thin but it cannot realize any space-saving effect.

To overcome this problem of the rear-opening enclosure, a type of system has been proposed in which an acoustic duct is formed so as to improve the phase difference (at best, equalize the phases) between the sounds radiated from the front and rear surfaces at the measuring point, even when the system is positioned in close contact with a rigid wall. FIG. 3 shows this type of system. An enclosure 3*g* has an opening 6 which ensures that a sound radiated from the rear surface of the diaphragm passes through the duct 6 and then through an acoustic passage 7 which is formed between the enclosure 3*g* and a rigid wall 4, the sound thereafter being radiated toward the front. The sound pressure level is thereby improved because the phase difference between the sounds radiated from the front and rear surfaces of the diaphragm is increased by a phase corresponding to a distance l, which should be compared with that displayed in the above-described example.

If, in this method, the area of the diaphragm is increased in order to reduce the amplitude of the motion of the diaphragm, the mass Ma in the gap between the rear side of the enclosure and the rigid wall ($Ma=(\ )^2M_P$, where $S_D$ represents the area of the diaphragm; $S_p$ represents the area of the opening; and $M_p$ represents the mass of air in the acoustic duct) is increased, thereby reducing the output sound pressure level.

SUMMARY OF THE INVENTION

The present invention has been achieved in consideration of the above-described problems, and an object of the present invention is to provide a speaker which is thin but which is capable of providing high-fidelity reproduction and ensuring a suitable level of sound pressure even when it is brought into close contact with a wall.

To this end, the present invention provides a speaker in which a closed chamber is provided for a part of a diaphragm mounted in an enclosure, and an open chamber is provided for the other part of the diaphragm.

In this construction, the phase difference between sounds radiated from the front and rear surfaces of the diaphragm is increased as much as possible by using an acoustic duct for the sound radiated through the open chamber, thereby minimizing the cancellation of sounds and improving the sound pressure level.

DESCRIPTION OF THE PREFERRED EMBODIMENTS

The preferred embodiments of the present invention will be described below with reference to the accompanying drawings.

The principle of the speaker in accordance with the present invention will first be described.

As mentioned above, the output sound pressure level is reduced because the sound radiated from the rear side of the speaker is reflected by the wall so as to cancel the sound radiated from the front surface of the speaker. It is possible to assume that, if the phase of the sound radiated from the rear side could be changed to a certain degree by some means, the output sound pressure level could be improved in accordance with this degree of change. It is possible to examine the change in the sound pressure level by assuming that a sound radiation front having the opposite phase is formed around the speaker and the phase of this sound is changed. The result of this is shown in FIG. 4.

Figure 1:
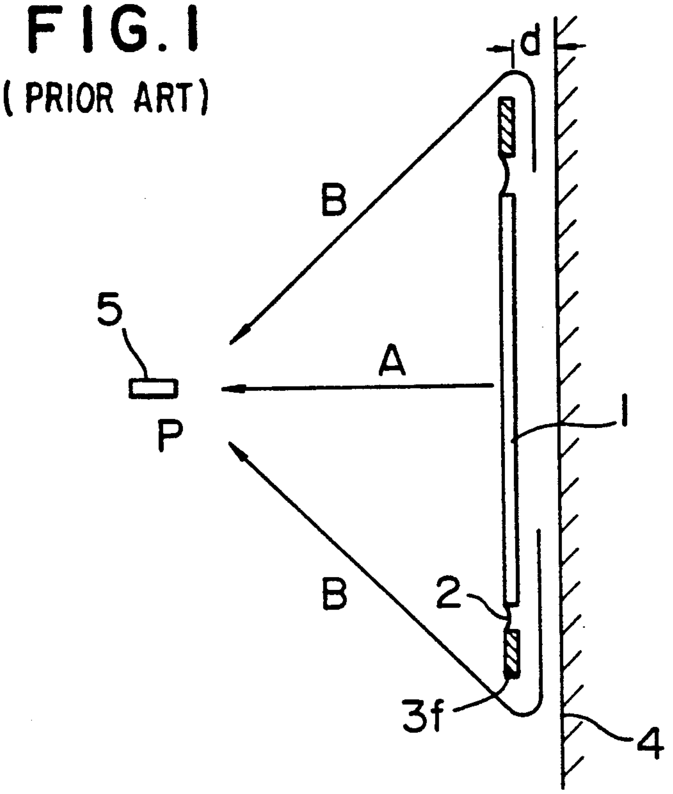
FIG. 1 (PRIOR ART)
FIG. 1 is a schematic cross-sectional view of a speaker system which is mounted adjacent a wall, with a sound passage being formed between the wall and the rear of the speaker system.
Figure 2:
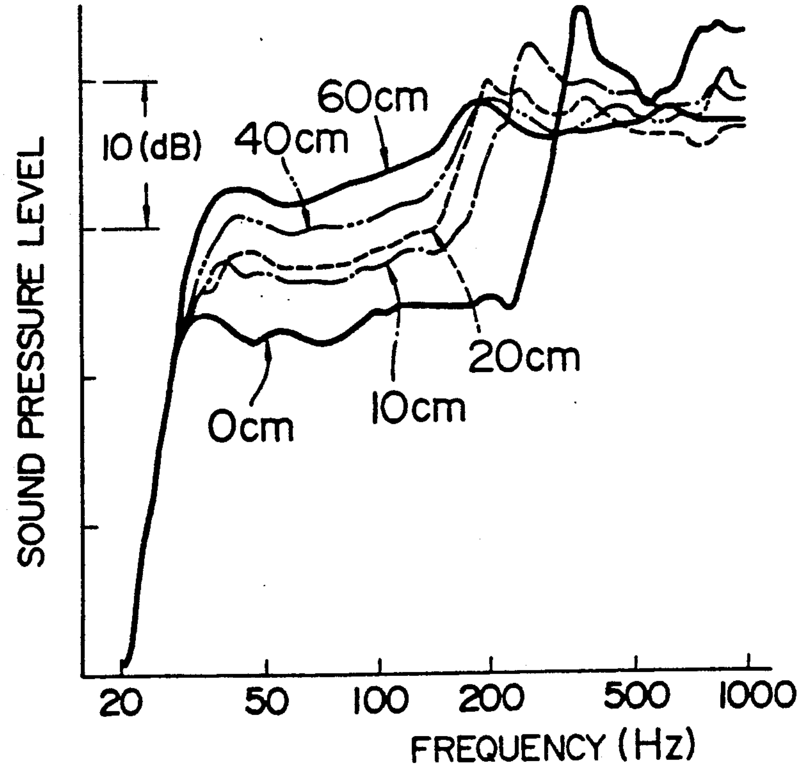
FIG. 2 is a graph of sound pressure frequency characteristics of the rear-opening speaker system mounted on the wall with respect to a parameter which is the distance between the speaker and the wall.
Figure 3:
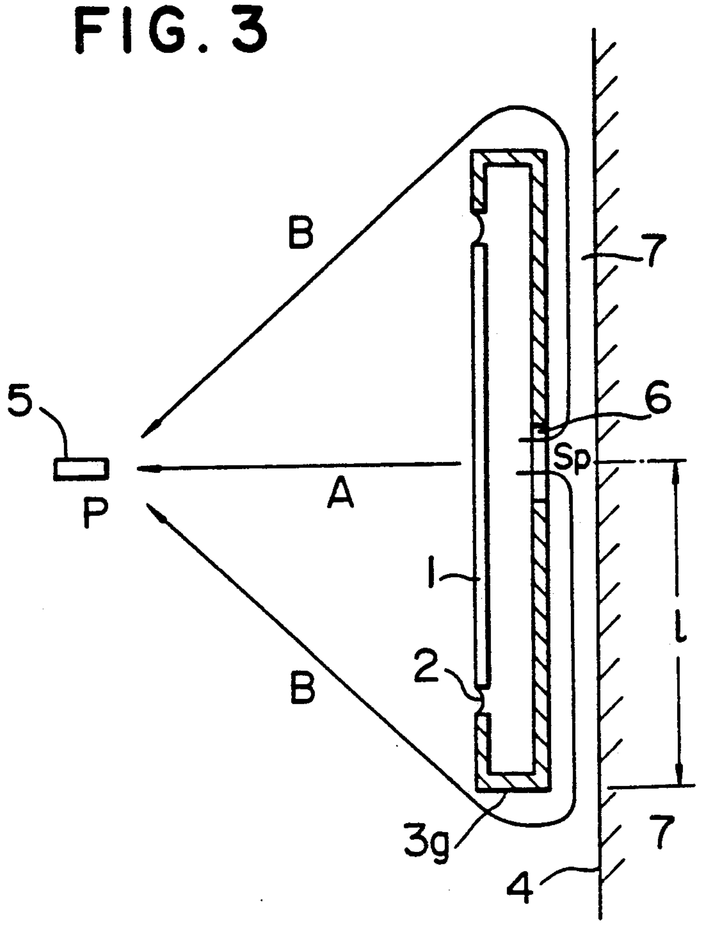
FIG. 3 is a schematic cross-sectional view of a speaker system and a sound passage, the system having a port formed at the rear of an enclosure.
Figure 4:
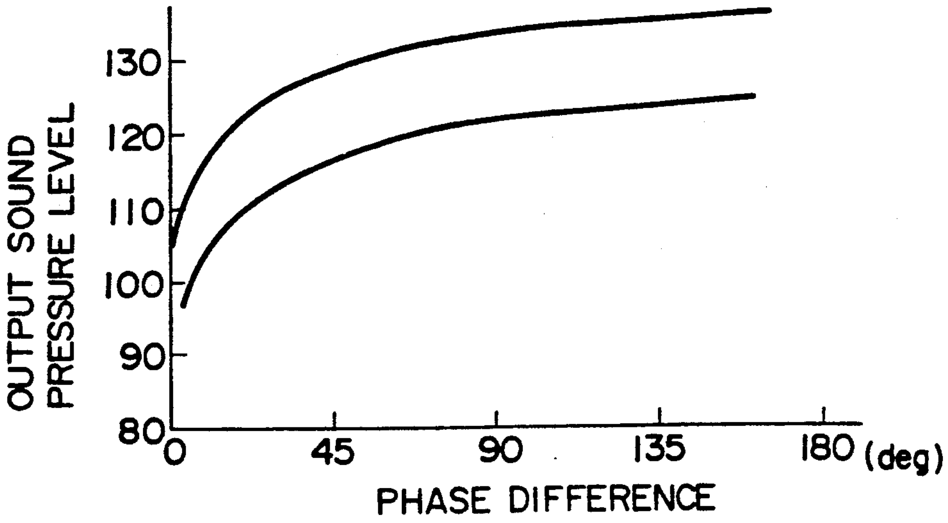
FIG. 4 is a graph of the relationship between the output sound pressure levels and the phase difference between sounds radiated from the front and rear of the speaker.

FIG. 4 is a graph of the relationship between the sound pressure levels and the phase difference between sounds radiated from the front and rear surfaces of the diaphragm. As shown in FIG. 4, a slight change in the phase causes a large increase in the output sound pressure level. If a speaker box is provided at the rear of the diaphragm so as to cover the entire area of the rear surface of the diaphragm, and if an opening is formed in the rear plate of this speaker box, a phase difference is created between sounds which are radiated from the front and rear surfaces of the diaphragm provided that the size of the speaker box is large, even though the box has a small thickness. Therefore, the provision of this speaker box enables the output sound pressure level to be improved.

Figure 5:
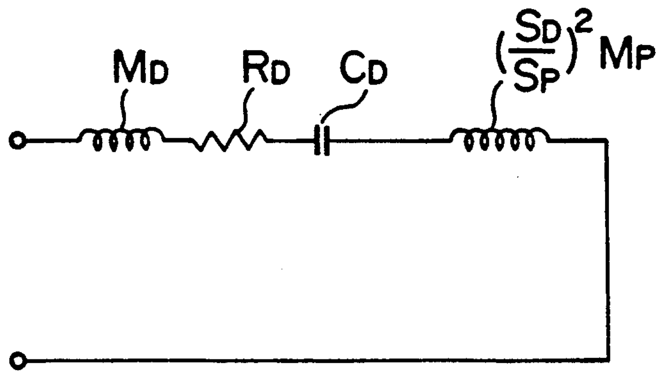
FIG. 5 is an equivalent circuit diagram of 10*a* thin speaker system having a phase difference.

However, if, in this case, the area of the diaphragm is increased so as to limit the amplitude of the movement of the diaphragm in order to reduce the thickness of the speaker, the disadvantages which will be described below are experienced. FIG. 5 shows an equivalent circuit of such a speaker. As can be understood from FIG. 5, the mass which is effective in the gap between the rear of the speaker box and the wall is multiplied by a transformation ratio n squared, and is added to the mass of the diaphragm.

The present invention has been achieved by further studying this speaker, as described below.

Figure 6:
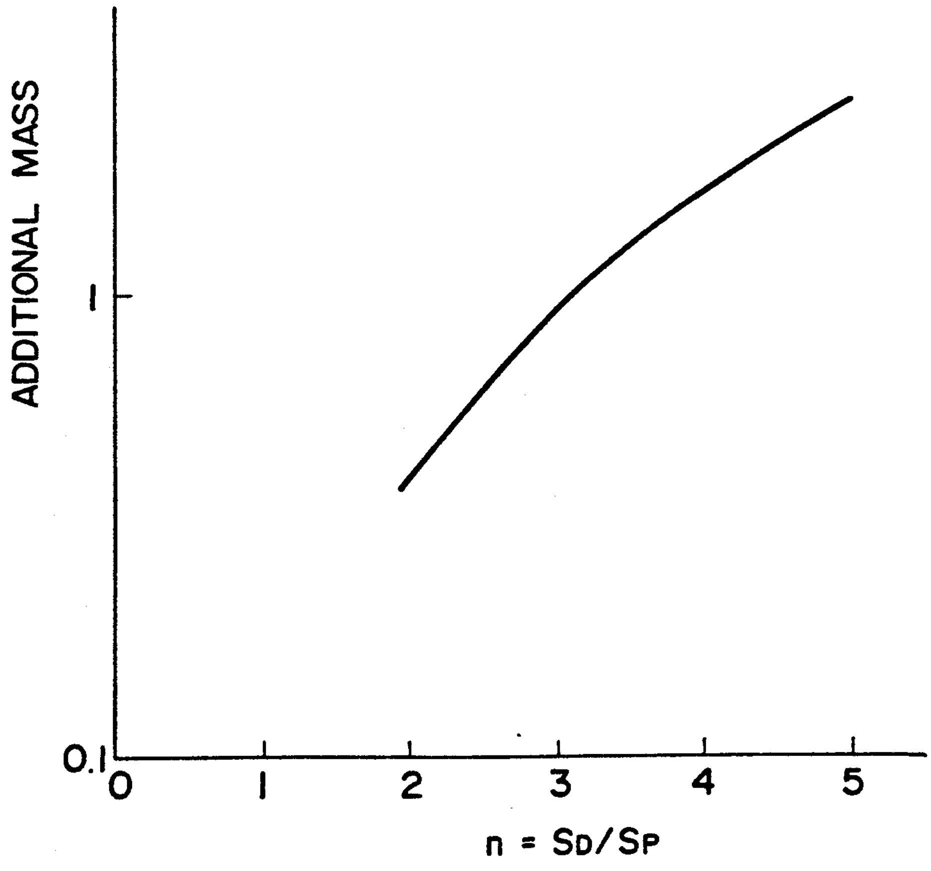
FIG. 6 is a graph of the relationship between additional mass and the area of a diaphragm.

It is easy for the central portion of the diaphragm to increase the output sound pressure by creating a certain phase difference, and it is easy for the peripheral portion thereof to cancel the sounds radiated from its front and rear surfaces since the length of the passage for the sound radiated from the rear is small. However, it is necessary to reduce the area of the diaphragm in order to eliminate the above-mentioned disadvantages. The acoustic duct effectively couples additional mass to the diaphragm, and FIG. 6 shows the relationship between the additional mass and the ratio between the area $S_D$ of the diaphragm and the area $S_P$ of the duct when the diaphragm is disposed at the center of a speaker box of $1\ m \times 1\ m \times 0.05\ m$. As shown in FIG. 6, the additional mass is certainly reduced if the area of the diaphragm is reduced (in FIG. 6, the term "n" represents the ratio between the areas $S_D$ and $S_P$). However, in this case, the diaphragm vibrates at a large amplitude, resulting in a solution which is not practical for the design of a thin speaker. For instance, if the area $S_D$ is 0.07 $m^2$, the oscillation of the diaphragm must be about 10 mm in amplitude to achieve a practical maximum output sound pressure of 110 dB at 1 m.

Figure 7:
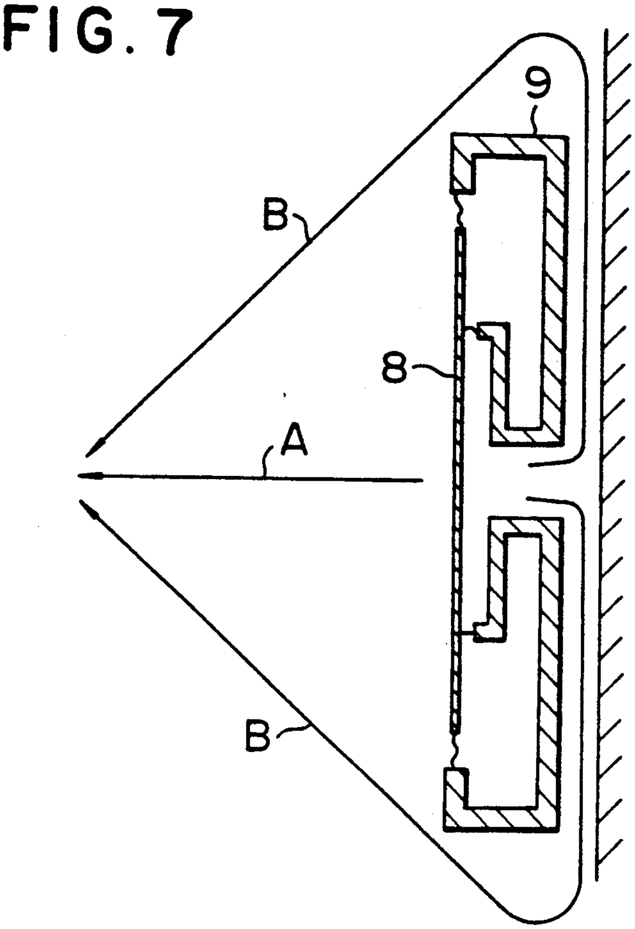
FIG. 7 is a cross-sectional view of a speaker in which the principle of the present invention is illustrated.
Figure 8:
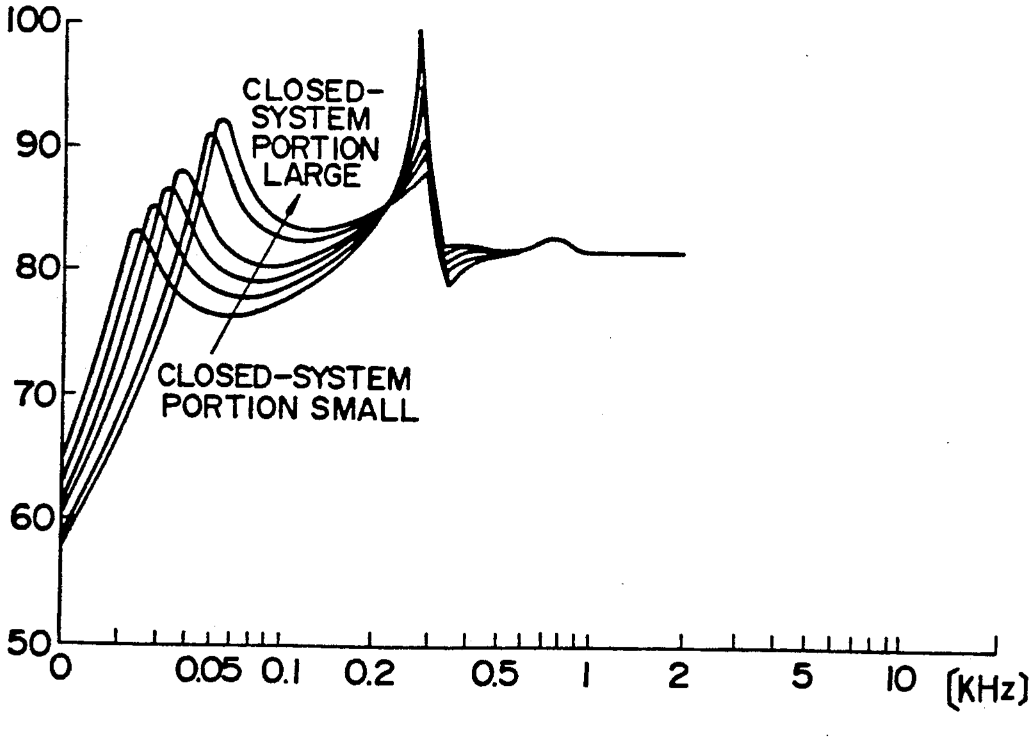
FIG. 8 is a graph of changes in the output sound pressure in accordance with the ratio of a closed system portion and an opened-system portion of the diaphragm.

If a portion about the center of a rigid diaphragm 8, shown in FIG. 7, has a small area and a rear-opening system so as to reduce the load while the remaining portion, including a peripheral portion of the diaphragm, forms a closed system so as to prevent the cancellation of sound, the entire area of a speaker box 9 can be utilized for the area of the diaphragm so that the thickness of the speaker is reduced while a large output sound pressure at a low amplitude is ensured. FIG. 8 shows changes in the output sound pressure when the balance between the rear-opening-system portion and the closed-system portion is varied. As shown in FIG. 8, for a given size of box, there is a solution which ensures suitable values of both $f_0$ and the output sound pressure level.

Figure 9:
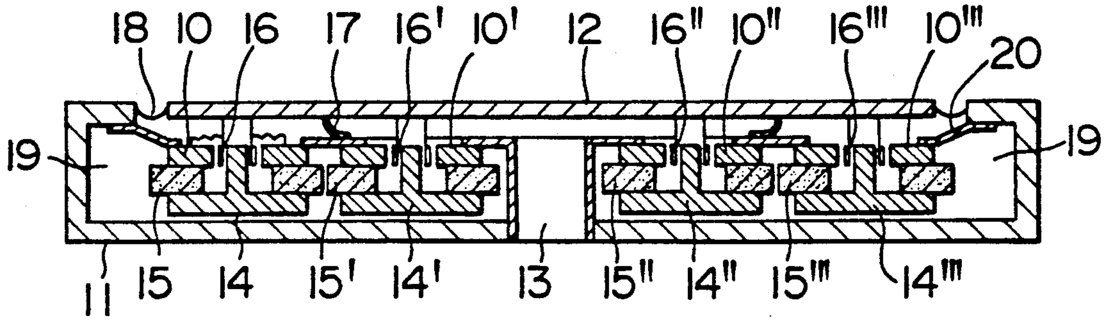
FIG. 9 is a cross-sectional view of a speaker which represents a first embodiment of the present invention.

FIG. 9 shows a speaker which represents an embodiment of the present invention in which a speaker unit having a rigid diaphragm 12 whose length and width are 0.8 m and 0.3 m, respectively, is attached to an enclosure of 1 m×1 m×0.05 m. Four magnetic circuits which provide driving forces are attached to the diaphragm 12. The magnetic circuits are constituted by magnets 15, 15', 15'', and 15'''; lower plates 14, 14', 14'', and 14'''; and upper plates 10, 10', 10'', and 10'''. In the magnetic gaps of the magnetic circuit, driving forces are generated by voice coils 16, 16', 16'', and 16'''. The interior of the enclosure 11 is partitioned by a woofer frame 20 and an internal suspension member 17, and is separated into a closed enclosure portion 19 and a rear opening 13. An edge suspension member 18 joins the diaphragm 12 to the housing 11.

In the speaker constructed in this manner, sound generated from the rear surface of a peripheral portion of the diaphragm 12, which contributes most to the cancellation of sound at the front side, is radiated into the closed enclosure portion 19, and sound generated from the rear surface of the central portion of the diaphragm, which contributes only slightly to the cancellation at the front side, is radiated through the rear hole 13. It is therefore possible to realize a speaker which can maintain its output sound pressure level when it is mounted on a wall.

A stepped portion may be formed in the rear plate of the enclosure in such a manner that an acoustic duct is formed by this stepped portion and the wall when the speaker is mounted on the wall. This acoustic duct may be formed in such a manner that the cross section of the duct expands as it approaches the outlet opening of the duct. Otherwise, a plate which acts as a wall may be previously fixed to the rear side of the speaker.

As described above, the present invention realizes a speaker which can maintain its output sound pressure level when it is mounted on a wall and which can be adapted for two kinds of use, such as one in which it is mounted on a wall and one in which it is freestanding, since it can exhibit its basic performance even when separated from the wall.

Figure 10:
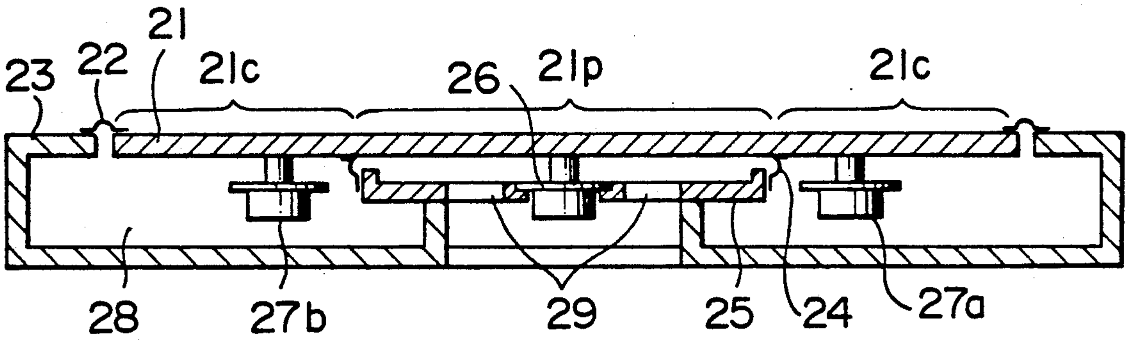
FIGS. 10 and 11 are cross-sectional views of essential parts of second and third embodiments of the present invention.

FIG. 10 shows a speaker which represents a second embodiment of the present invention. As shown in FIG. 10, the speaker has a rigid diaphragm 21, an edge suspension member 22, a speaker box 23, an internal suspension member 24, a partition plate 25, a closed space 28, and an open space 29. The fundamental construction of this speaker is substantially the same as that shown in FIG. 9. Portions 21*c* of the diaphragm 21 operate as closed systems, and a portion 21*p* operates as an open system. In this embodiment, the areas of the portions 21*c* and 21*p* of these two systems are approximately equal to each other. The speaker is further provided with a driver unit 26 which is attached to the open-system portion 21*p*, and driver units 27*a* and 27*b* which are attached to the closed-system portions 21*c*. In FIG. 10, the frame of the speaker is omitted in order to avoid complication.

In this embodiment, the diaphragm 21 has one drive point in the open-system portion 21*p*, and two drive points in the closed-system portions 21*c*. Since the areas of the closed-system portions 21*c* and the open-system portion 21*p* of the diaphragm 21 are substantially the same, the driving force per unit area of the diaphragm 21 applied to the closed-system portions 21*c* is twice as large as that applied to the open system portion 21*p*. It is thereby possible to enable suitable piston motion of the diagram although, during low-frequency reproduction, the vibration amplitude of the closed-system portions 21*c* of the diaphragm is basically less than that of the open-system portion 21*p* because of the large stiffness of the closed system due to the existence of the closed space 28.

The present invention will be further described below with respect to other embodiments thereof in conjunction with the corresponding drawings.

Figure 11:
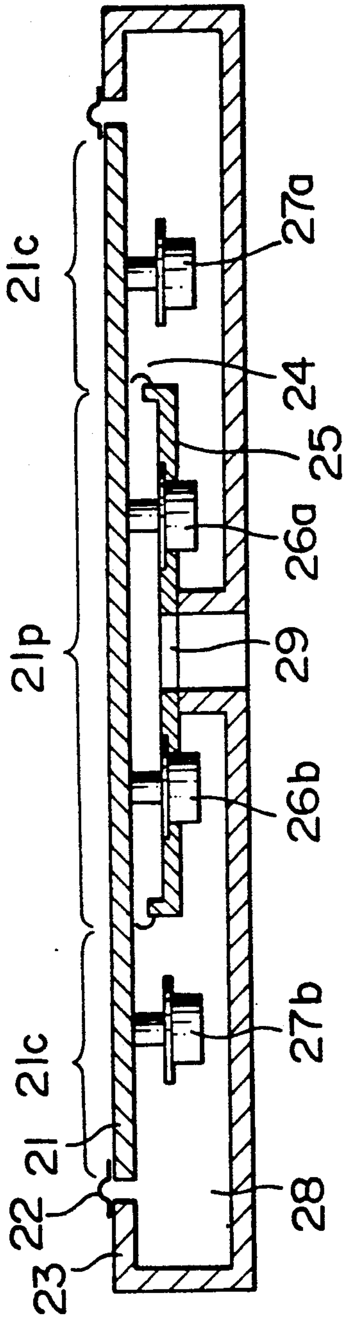

FIG. 11 shows a third embodiment of the present invention which differs from that shown in FIG. 10 in that two driver units 26*a* and 26*b* are provided on the open-system portion 21*p* of the diaphragm 21. In this embodiment, the areas of the open-system portion 21*p* and the closed-system portions 21*c* are approximately equal to each other, but the driving forces of the driver units 26*a* and 26*b* are weighted so as to realize suitable piston motions of the diaphragm 21. That is, the driving force of the driver units 27*a* and 27*b* for driving the closed-system portions 21*c* is set to be larger than that of the driver units 26*a* and 26*b* for driving the open-system portion 21*p* so that the difference of the stiffnesses for the open-system portion 21*p* and the closed-system portions 21*c* at the time of low-frequency reproduction is canceled; and the amplitudes of the portions 21*c* and 21*p* of the diaphragm 21 are generally equalized, thereby realizing piston motions of the diaphragm.

To provide a difference between the driving forces per unit area of the closed-system portion and the open-system portion of the diaphragm, the number of driver units 26*a* and 26*b* are selected in the embodiment shown in FIG. 10, and the driving forces of the driver units are weighted. However, the ratio of the areas of the open- and closed-system portions may be changed for this purpose within the design limitations.

In the direct radiator-type speaker in accordance with this embodiment in which a part of the diaphragm forms a closed system and the other part forms an open system, the diaphragm has a plurality of drive points; and each of the driving forces is weighted or the disposition of drive points is selected suitably, so that the driving force per unit area of the closed system portion of the diaphragm is increased relative to that of the open-system portion, thereby enabling suitable piston-motion vibrations of the diaphragm at the time of low-frequency reproduction.

Figure 12:
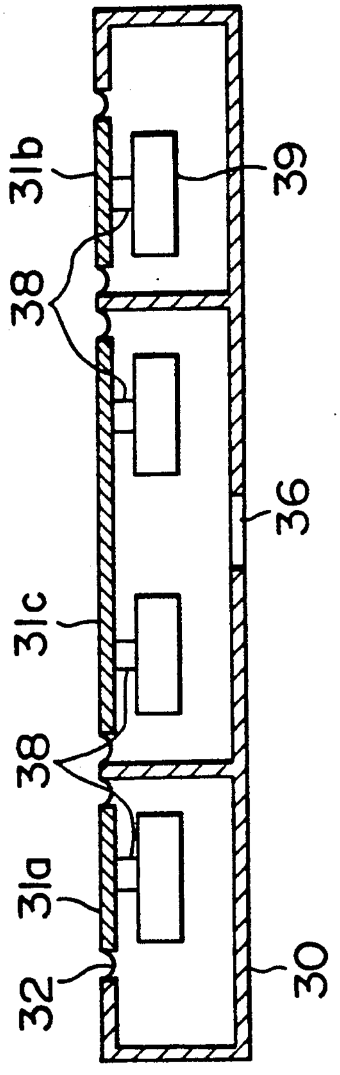
FIG. 12 is a cross-sectional view of a fourth embodiment of the present invention.

A fourth embodiment of the present invention will now be described below with reference to FIGS. 12 and 13. As shown in FIG. 12, a speaker which represents the fourth embodiment is provided with an enclosure 30 of 1 m×1 m×0.06 m, rigid diaphragms 31*a* and 31*b* of 30 cm×17 cm and a diaphragm 31*c* of 30 cm×46 cm. Each of the diaphragms is formed of a member which is made of a cellular material, which has a thickness of 8 mm and which is sandwiched between aluminum surfacing members. Closed enclosures are provided at the rear of the diaphragms 31*a* and 31*b*, and a rear-opening enclosure having an opening 36 is provided at the rear of the central diaphragm 31*c*. The diaphragms are driven by four voice coils 38. This speaker also has edge suspension members 32, and magnetic circuits 39 for driving the voice coils 38 respectively.

Figure 13:
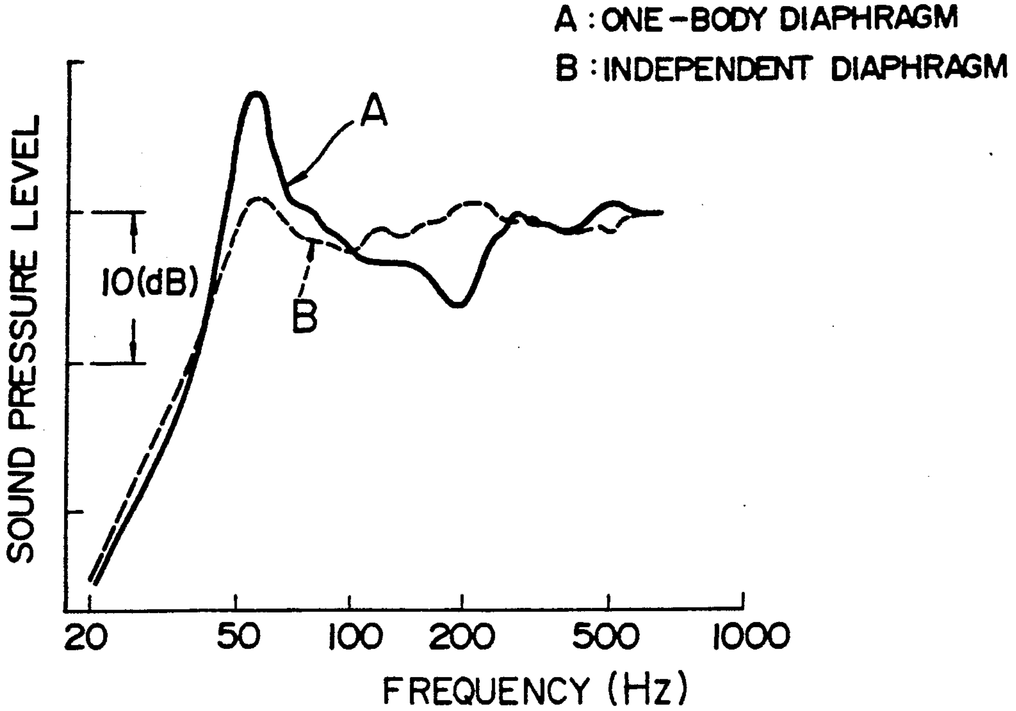
FIG. 13 is a graph of sound pressure frequency characteristics of the fourth embodiment.

FIG. 13 shows the sound pressure frequency characteristics of this embodiment. If the diaphragm is formed in one unitary body as in the case of a traditional unit, the loads on the rear surfaces of the closed-system portions and the open-system portion differ from each other so that concentration of stress occurs in the vicinity of the boundary between the closed-system portions and the open-system portion, resulting in distortion and peaks and dips in the sound pressure frequency characteristic curve which is exemplified by the curve A in FIG. 13. The characteristics of the independently-driven diaphragms in accordance with the present invention exhibit only small peaks and dips, as exemplified by the curve B in FIG. 13, compared with the characteristic indicated by the curve A in FIG. 13. In addition, the frequency response range of the diaphragms in accordance with the present invention is expanded.

Figure 14:
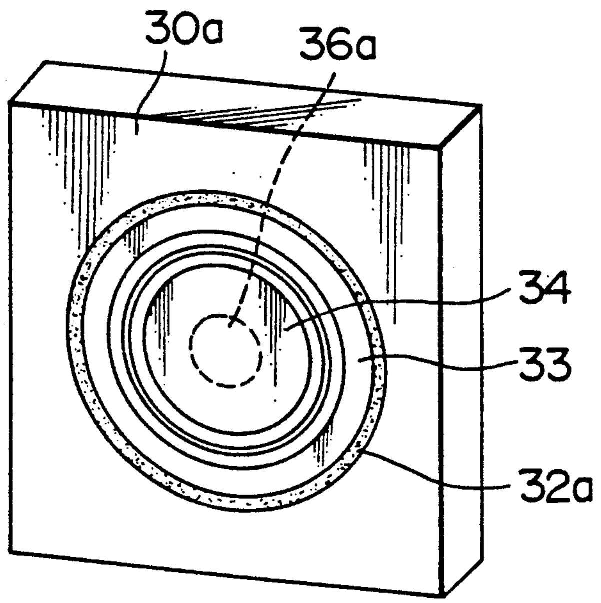
FIG. 14 is a perspective view of a fifth embodiment of the present invention.

In this embodiment, the diaphragms are rectangular, but the present invention is effective irrespective of the shape of the diaphragm. It is possible to realize the same effect by a speaker which has, as shown in FIG. 14, coaxial diaphragms 33 and 34 connected to an enclosure 30*a* by an edge suspension member 32*a* and in which an open chamber having an opening 36*a* is formed at the rear of the central portion; and a closed chamber is formed at the rear of the peripheral portion.

Figure 15A:
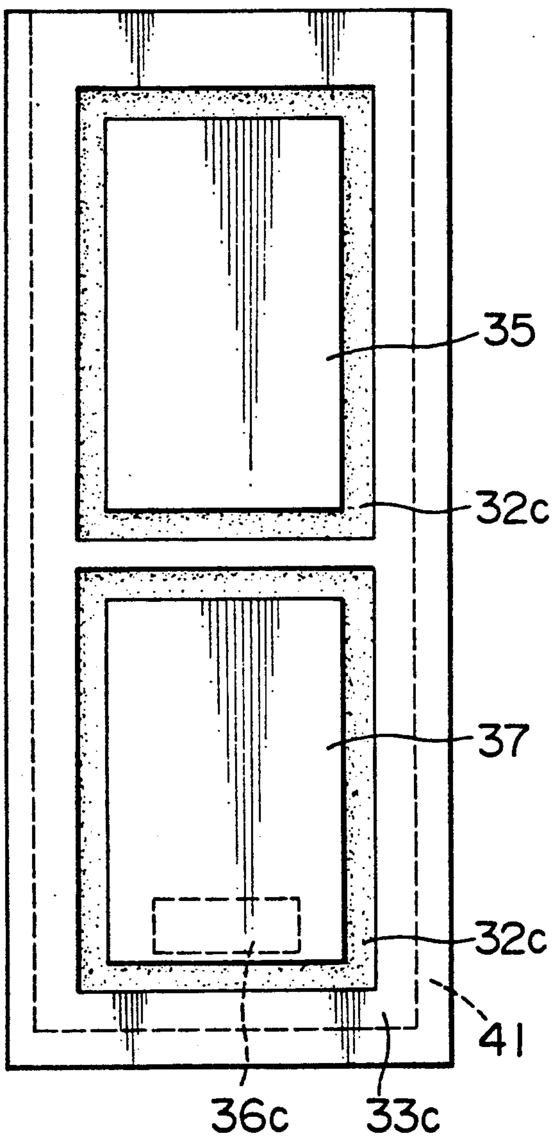
FIG. 15A is a front view of a sixth embodiment of the present invention.
Figure 15B:
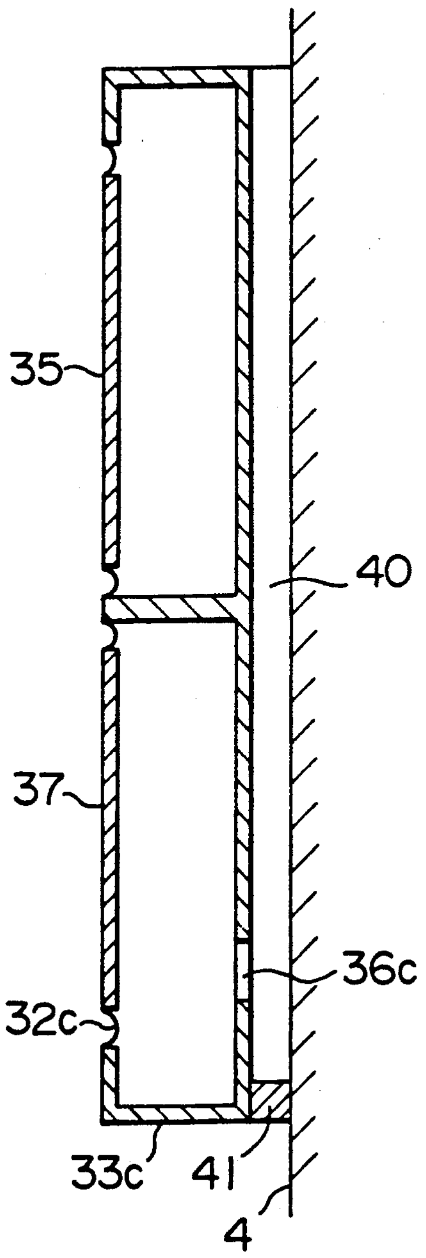
FIG. 15B is a cross-sectional view of the sixth embodiment.
Figure 16:
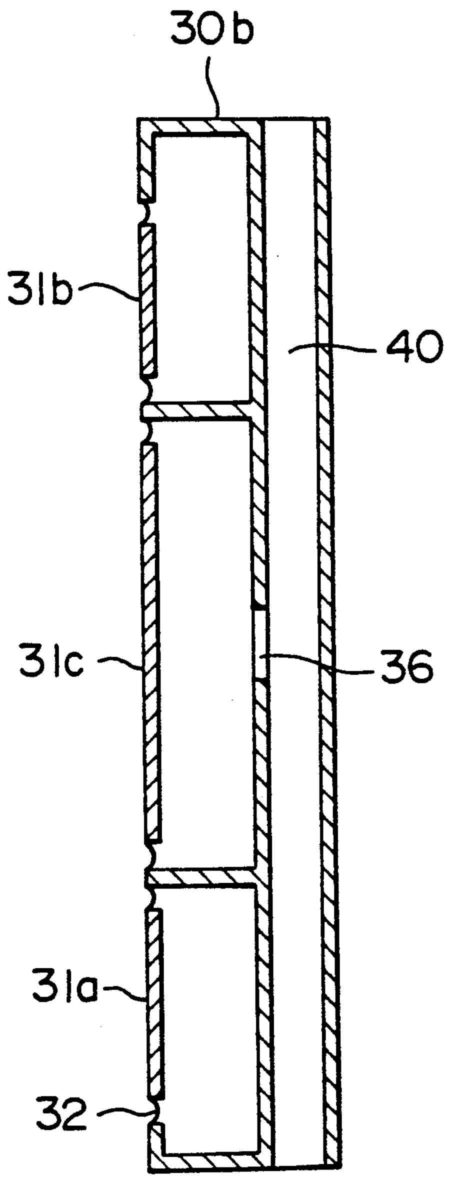
FIG. 16 is a cross-sectional view of a seventh embodiment of the present invention.
Figure 17A:
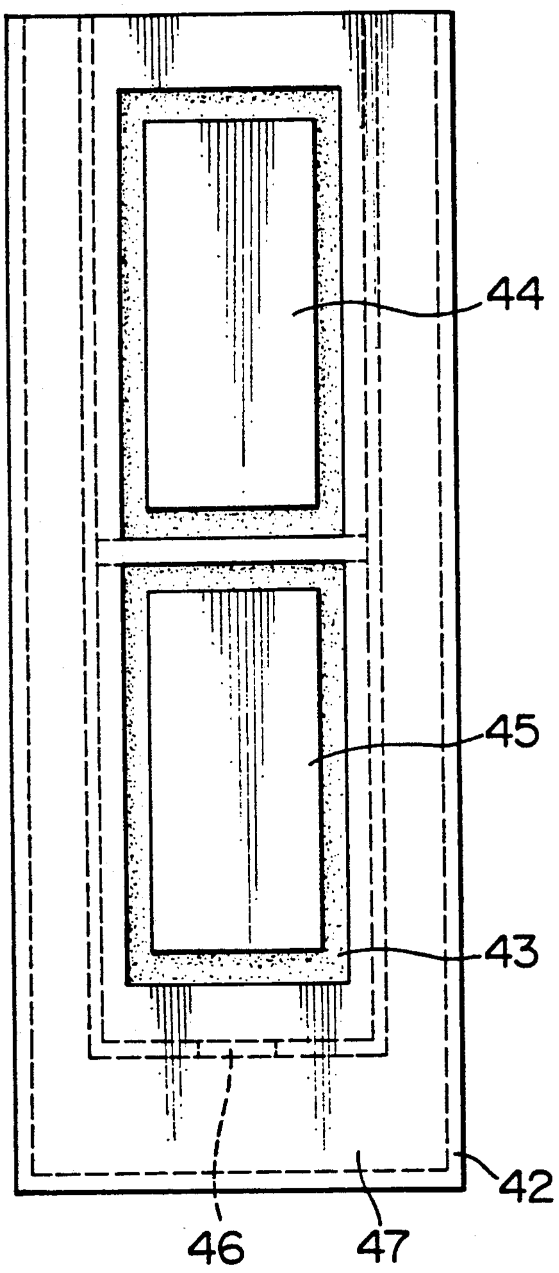
FIG. 17A is a front view of an eighth embodiment of the present invention.
Figure 17B:
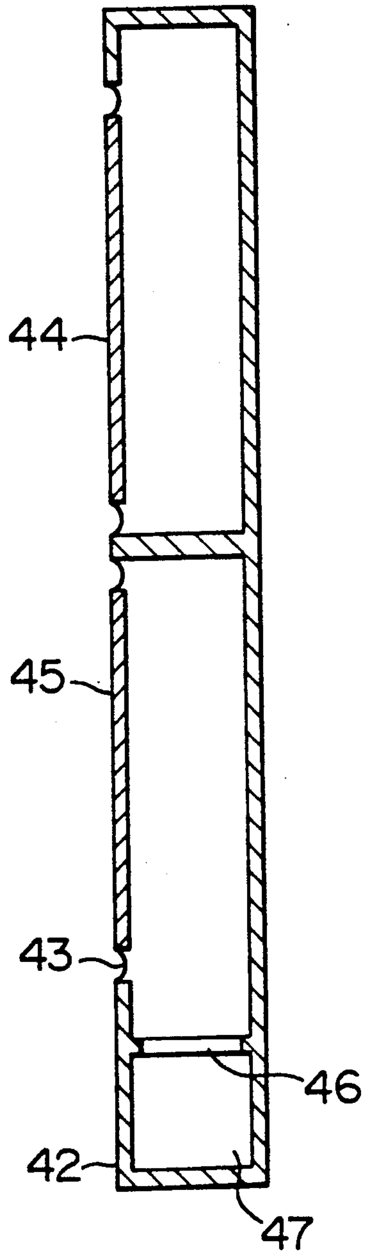
FIG. 17B, is a cross-sectional view of the eighth embodiment of the present invention.

If the size of the enclosure is so small that it is not possible to provide an adequate phase difference between the sound radiated from the front surface and the sound radiated through a port formed at the rear plate of the speaker, the speaker may advantageously be designed as shown in FIGS. 15A and 15B. In FIGS. 15A and 15B, an enclosure 33*c* is provided with an opening 36*c;* rigid diaphragms 35 and 37 are supported by edge supporting members 32*c* on the enclosure; and cross-pieces 41 are attached to the enclosure so as to form an acoustic duct 40 between the rear surface of the enclosure and a rigid wall 4, thereby radiating sound from the port to the front of the speaker via the acoustic duct 40. Of course, as shown in FIG. 16, the acoustic duct 40 may be formed so as to be integral with an enclosure 30*b* instead of utilizing the surface of the wall. To limit the thickness of the enclosure, the speaker may be constructed in such a manner that, as shown in FIGS. 17A and 17B, diaphragms 44 and 45 are supported by edge supporting members 43 on the central portion of an enclosure 42; and an acoustic duct 47 which communicates with an opening 46 is formed in side portions of the enclosure 42 such as to encircle this central portion. These arrangements not only eliminate the need to closely attach the enclosure to the rigid wall but also enable the speaker to be mounted on the wall no matter how irregular the wall surface.

In accordance with the present invention, as described above, diaphragms are provided to form a rear-opening system and a closed system independently, so that the piston-vibration range of the diaphragm is remarkably expanded; the frequency characteristic curve is flattened; and the ratio of distortion is reduced. Moreover, the thickness and the weight of the diaphragm assembly can be reduced since each diaphragm has a reduced size and, hence, an improved flexural rigidity. Therefore, the output sound pressure level is increased. In addition, the degree of freedom in disposing the diaphragm is increased, thereby making the assembly work easier.

A ninth embodiment of the present invention will be described below with reference to FIGS. 18 and 19. The features of this embodiment reside in the fixation of voice coils on the rigid diaphragm. Voice coils, each of which is suspended by a damper in an annular gap of a magnetic circuit formed between a top plate and a bottom plate fixed to the upper and lower surfaces of an annular magnet, are fixed to a flat rectangular diaphragm at the points or in the vicinity thereof at which both vibrations of the primary free resonance mode and those of the secondary free resonance mode of the diaphragm in the longitudinal direction thereof are restrained. The diaphragm is supported at its outer periphery by an edge suspension member or the like on a frame.

For resonance in the longitudinal direction alone in this construction, it is possible to substitute the resonance form of an opposite-end-free rod for that of the flat rectangular diaphragm. A forced vibration displacement $\xi$ by a concentrated driving force $F_x e^{j\omega t}$ is expressed by $$\xi = \frac{F_x}{\rho s l} \sum_m \frac{1}{\omega_m^2 - \omega^2} \Sigma_m(x)\Sigma_m(y)e^{j\omega t} \quad (1)$$

where $\rho$: density;

s: sectional area of the rod;

l: length of the rod;

$\Sigma m(x)\Sigma m(y)$: criterion function which represents the vibration form; and $\omega$: angular velocity.

When the rod is driven at four points $x_1$, $x_2$, $x_3$ and $x_4$, the forced vibration displacement $\xi$ is $$\xi = \frac{1}{\rho s l} \sum_m \frac{1}{\omega_m^2 - \omega^2} \{F_{x1}\Sigma_m(x_1) + F_{x3}\Sigma_m(x_3) + F_{x3}\Sigma_m(x_3) + F_{x4}\Sigma_m(x_4)\}\Sigma_m(y)e^{j\omega t} \quad (2)$$

No asymmetrical mode vibration occur if the rod is driven symmetrically about the center thereof, but primary and secondary resonance modes other than asymmetrical modes may arise. A driving method which is free of the occurrence of vibrations of such primary and secondary modes, so that piston-like motion results, can be attained by selecting four points $x_1$, $x_2$, $x_3$ and $x_4$ which satisfy the equation:

$$F_{x1}\Sigma m(x_1) + F_{x2}\Sigma m(x_2) + F_{x3}\Sigma m(x_3) + F_{x4}\Sigma m(x_4) = 0$$

$x_4$ (3)

Since the rod is driven symmetrically about the center thereof by the same magnitudes of forces, $$F_{x1} = F_{x2} = F_{x3} = F_{x4} = F_x \quad (4)$$

Accordingly, for the primary mode Equation 3 simplifies to:

$$\Sigma_1(x_1) + \Sigma_1(x_2) + \Sigma_1(1-x_2) + \Sigma_1(1-x_1) = 0 \quad (5)$$

Similarly, for the secondary mode Equation 3 leads to:

$$\Sigma_2(x_1) + \Sigma_2(x_2) + \Sigma_3(1-x_2) + \Sigma_3(1-x_1) = 0 \quad (6)$$

Driving points $x_1$ and $x_2$ which satisfy both Equations (5) and (6) are obtained as follows:

$$
\left.\begin{array}{l}
x_1 = 0.1130 \\
x_2 = 0.37775 \\
x_3 = (1 - x_2) = 0.62225 \\
x_4 = (1 - x_1) = 0.8870
\end{array}\right\} \quad (7)
$$

According to the present invention, the diaphragm is driven at the points represented by Equations (7). Therefore, there is no possibility of vibrations at the primary or secondary resonance mode. The piston motion range of the diaphragm is thereby expanded, and the sound pressure frequency characteristic curve is flattened.

The method in accordance with this embodiment may be applied to each of the above-described embodiments. This embodiment will be further described in detail with reference to FIGS. 18 and 19.

Figure 18:
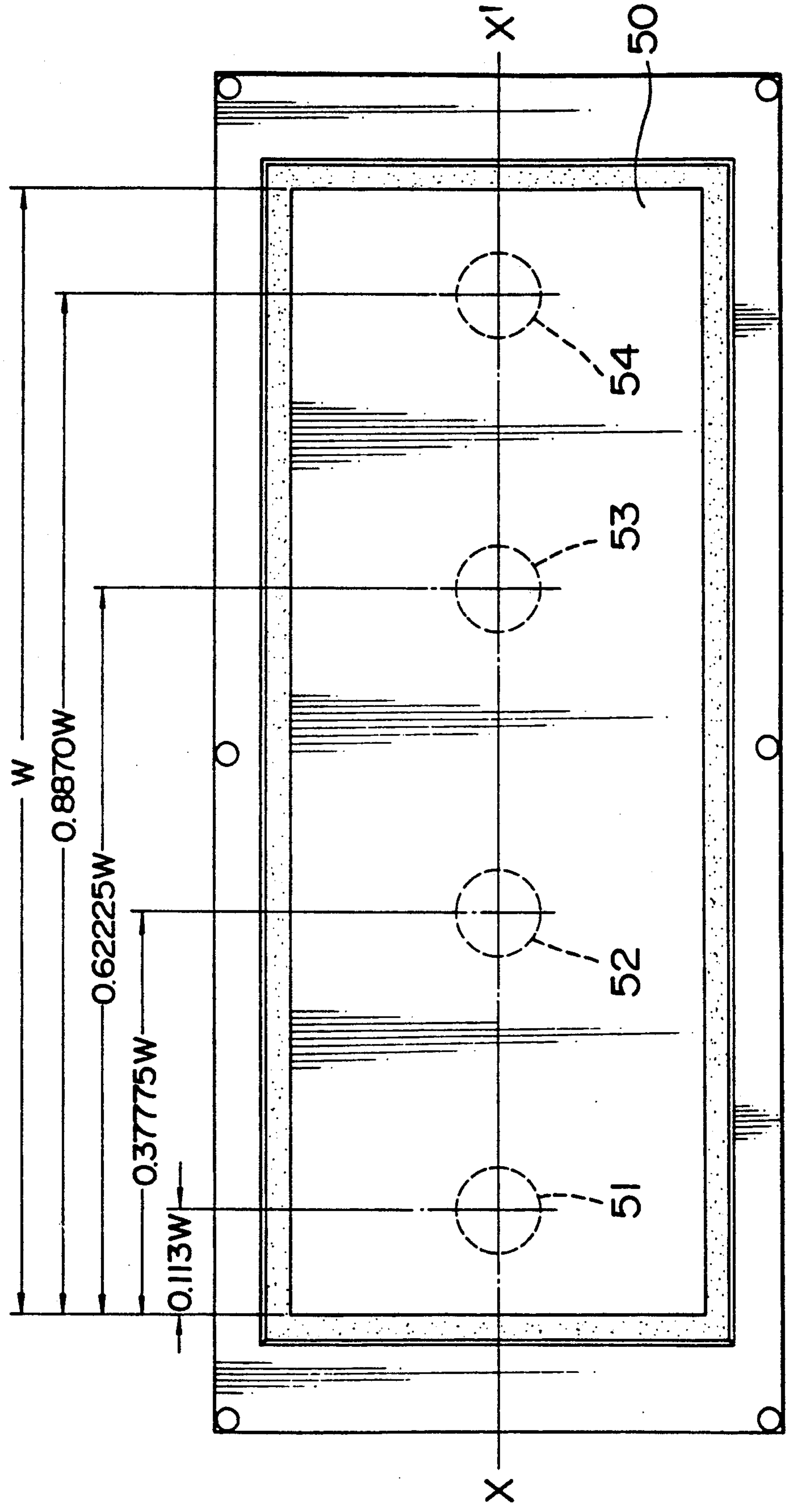
FIG. 18 is a front view of a ninth embodiment of the present invention in which the positions at which voice coils are fixed to the diaphragm are indicated.

As shown in FIG. 18, four voice coils 51, 52, 53 and 54 are attached to a diaphragm 50 at the points or in the vicinity thereof at which both free resonances of the primary resonance mode and of the secondary resonance mode of the diaphragm 50 in the longitudinal direction are restrained, that is, the points that are located, if the width of the diaphragm 50 is W, at distances of 0.113 W, 0.37775 W, 0.62225 W, and 0.8870 W from the end of the diaphragm 50.

These values represent the ratios of the distances of points on the diaphragm to lengthwise dimension of the diaphragm. Since the voice coils are fixed to the diaphragm at the positions defined by the values shown in Equations (7), vibration of the diaphragm in the primary resonance mode and the secondary resonance mode can be restrained.

Figure 19:
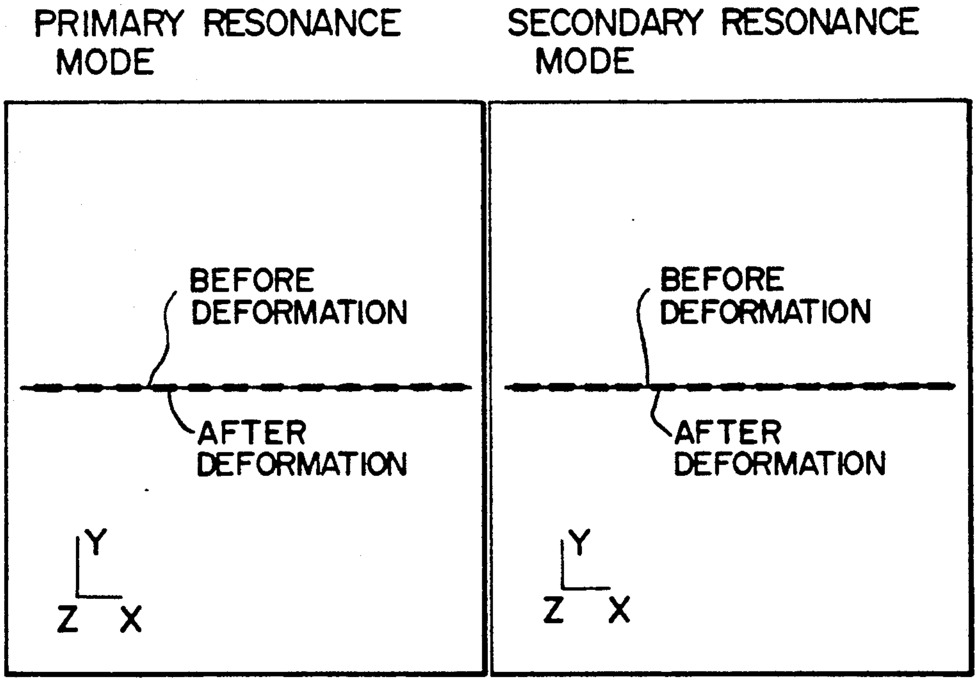
FIG. 19 is a graph of the characteristics of the ninth embodiment.

FIG. 19 shows the results of calculations of the vibration form on the basis of a finite element method when the diaphragm is driven at the points which satisfy Equations (7). The solid line indicates the state before the occurrence of deformation, and the broken line indicates the state after the occurrence of deformation. As will be understood from FIG. 19, the vibrations of the diaphragm in the primary and secondary resonance modes are restrained so that the diaphragm exhibits piston motions. Thus, the present invention can provide a flat rectangular speaker which has flat and smooth sound pressure frequency characteristics.

In the above-described embodiments, the peripheral edges of the opening formed in the rear plate of the enclosure are angular, but they may be smoothly curved or tapered, such as those shown in FIG. 20, which will be described below.

Figure 20:
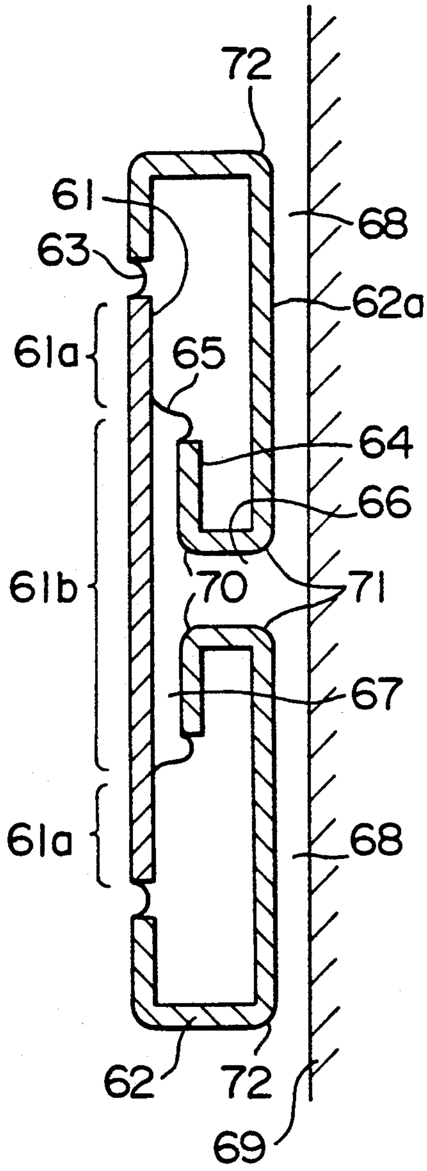
FIG. 20 is a schematic cross-sectional view of a tenth embodiment of the present invention.

FIG. 20 is a cross-sectional view of a speaker which represents a tenth embodiment of the present invention and in which some parts are omitted. The speaker shown in FIG. 20 has a rigid diaphragm 61 having a width of 30 cm and a length of 80 cm. Diaphragm 61 is made of a cellular material, which has a thickness of 8 mm and which is sandwiched between aluminum surfacing members. The diaphragm 61 is supported by an edge suspension member 63 on a 1 m square enclosure 62 having a thickness of 6 cm. At the rear of a peripheral portion of the diaphragm 61 is formed a closed-type construction, the sides of which are defined by the peripheral portion of the diaphragm, a rear plate 62*a* of the enclosure, an internal plate 64 extending from the enclosure rear plate 62*a*, and an internal suspension member 65 interposed between the top of the internal plate 64 and an intermediate portion of the diaphragm 61. At the rear of a central portion 61*b* of the diaphragm 61 is formed an open-type construction which has a gap 67 between this central portion 61*b* and the internal plate 64 and communicates with the space formed at the rear of the enclosure rear plate 62*a* through a duct 66. Duct 66 is encircled by the internal plate 64, and communicates with the gap 67 at its front end and opens at its rear end in the rear plate 62*a*. The duct 66 communicates with the outside through a gap 68 which is formed between the enclosure rear plate 62*a* and a wall 69. An outer peripheral edge 70 of the throat of the duct 66 and an outer peripheral edge 71 of the mouth of the duct 66 are curved smoothly or tapered, and an outer peripheral edge 72 of the enclosure rear plate 62*a* facing the wall 69 is also curved smoothly or tapered. The diaphragm 61 is driven by four voice coils (not shown) at the positions that correspond to the nodes of the primary and secondary normal resonance modes in the longitudinal direction of the diaphragm.

Figure 21A:
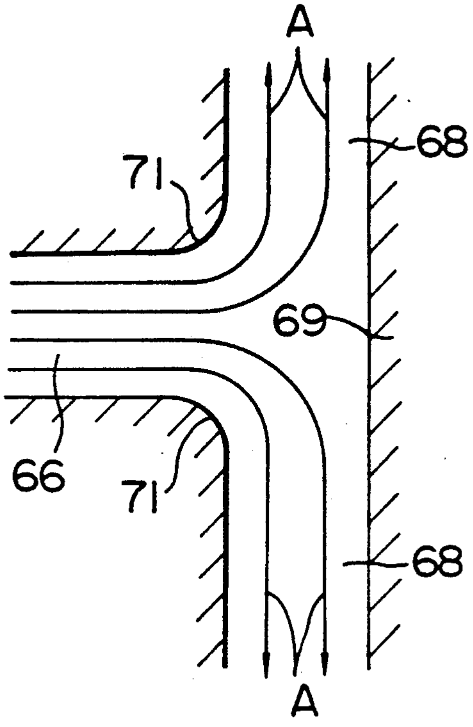
FIGS. 21A and 21B are enlarged cross-sectional views of essential parts of the tenth embodiment.

In this system, air in the gap 67 between the central portion 61*b* of the diaphragm 61 and the internal plate 64 is compressed and expanded by the vibration of the diaphragm 61 so as to cause air flows A in the direction of progress of sound waves, as indicated by the arrows A in FIG. 21A. These air flows A pass through the duct 66 and the gap 68 which serves as an acoustic duct communicating with the outside. When the air flows A pass over the peripheral edges 70 and 71 of the throat and the mouth of the duct 66 and over the outer peripheral edge 72 of the enclosure rear plate 62*a*, there is no possibility of vortexes. Therefore, the occurrence of distortion due to wind noise can be limited, thereby enabling high-fidelity reproduction. On the other hand if the smoothly curved peripheral edges were angular instead, as illustrated by angular portions 73 in FIG. 21B, turbulence as illustrated by arrows A' might arise.

Figure 21B:
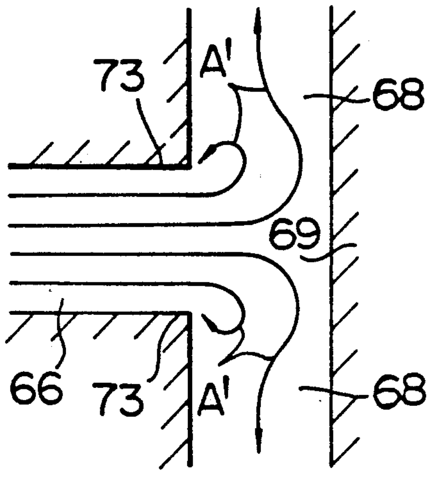
Figure 22A:
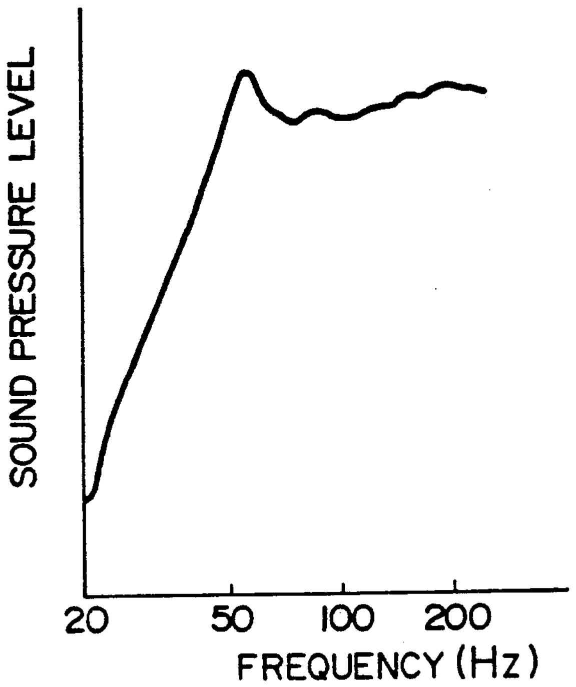
FIGS. 22A and 22B are graphs of the sound pressure frequency characteristics and the distortion frequency characteristics of the tenth embodiment.
Figure 22B:
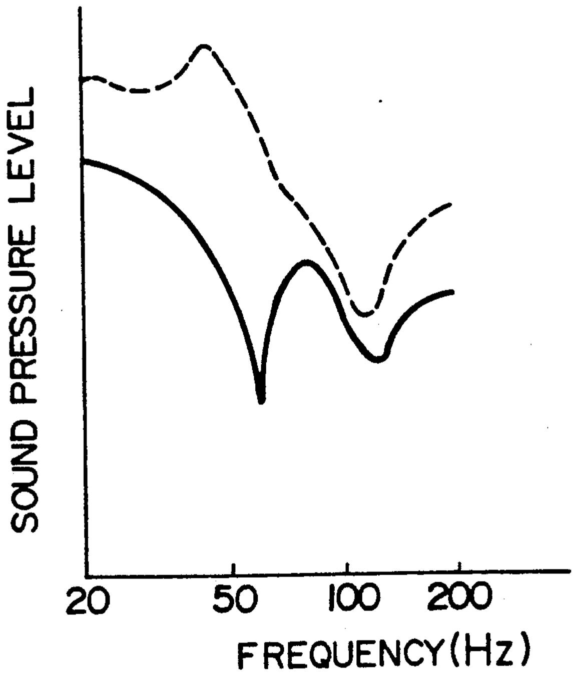

FIGS. 22A and 22B show sound pressure frequency characteristics and distortion frequency characteristics of this speaker, with the sectional area of the duct 66 being 230 cm$^2$; the height of the duct being 4 cm; the curvature of each of the opening peripheral edges 70 and 71 and the outer peripheral edge 72 being $R_{ZO}$; and the gap 68 defined between the speaker and the wall 69 when the speaker is mounted on the wall being 1 cm. The distortion frequency characteristics of a speaker having angular portions 73 which have not been rounded, as shown in FIG. 21B, are indicated in FIG. 22B, which fluxuates highly. As is clear from FIG. 22B, the distortion of such a speaker is higher than that of this embodiment of the present invention in the lower frequency region.

Figure 23:
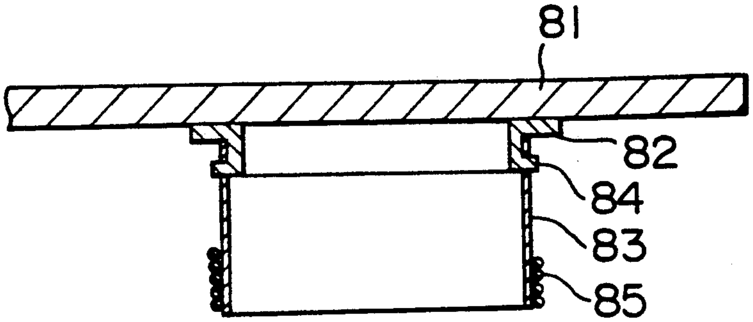
FIG. 23 is a cross sectional view of an essential part of the speaker in accordance with the present invention, which illustrates the state in which a voice coil is connected to a diaphragm.

In the above-described embodiments, the diaphragm and the driving units may be connected to each other by using a fixing method or fixing structure which will be described below with reference to FIGS. 23 and 24. FIG. 23 is a cross-sectional view of essential parts of a diaphragm and a voice coil which are fixed to each other, and FIG. 24 is a side view of the voice coil cap and voice coil shown in FIG. 23.

Figure 24:
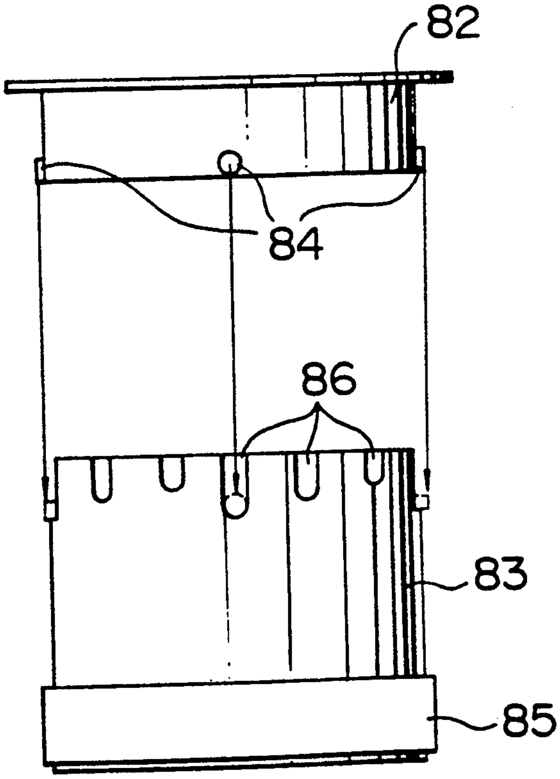
FIG. 24 is a side view of the voice coil cap and voice coil shown in FIG. 23.

The structure shown in FIGS. 23 and 24 includes a flat diaphragm 81 and a voice coil cap 82, which has a flat end surface with a flange portion that is connected to the surface of the flat diaphragm 81. Voice coil cap 82 has a plurality of projections 84 formed o the outer periphery of a cylindrical portion. These projections 84 are inserted into groups of slots 86 formed at one end of a voice coil bobbin 83, which is positioned in a magnetic gap (not shown). A voice coil 85 is wound around bobbin 83. The groups of slots 86 comprise a plurality of opposed pairs of slots formed at the end of the voice coil bobbin 83 to different depths. It is preferable for the projections 84 to be disposed at regular intervals.

The voice coil cap 82 is inserted into and fixed to the voice coil bobbin 83. At this time, one of the groups of slots 86 at the end of the voice coil bobbin 83 is selected, the selected group of slots 86 having a depth which minimizes the gap between the voice coil cap and the diaphragm. The projections 84 of the voice coil gap 82 are inserted into the selected group of slots to the ends of the slots. The voice coil cap 82 is thereafter fixed to the voice coil bobbin 83. The number of slots in each group is three to four, which is preferred in terms of balance. Accordingly, the total number of slots is obtained by multiplying this number by the number of steps for adjusting the depth. That is, if the number of projections 84 is four and if three different depths are provided, the total number of slits is $4 \times 3 = 12$.

The speaker thus constructed operates as described below. A driving force is generated in accordance with an audio current which flows through the voice coil 85, and it is transmitted to the flat diaphragm 81 via the voice coil bobbin 83 and the voice coil cap 82, thereby generating sound.

In accordance with the present invention, as described above, a plurality of projections 84 are formed at one end of the cylindrical portion of the voice coil cap 82 having a flat end surface at the other end. When these projections 84 are inserted into one of the groups of slots 86 formed at the corresponding end of the voice coil bobbin 83 so as to fix the voice coil cap 82 to the voice coil bobbin, a group of slots having a depth which minimize the gap between the surface of the diaphragm 81 and the flat end surface of the voice coil cap 82 can be selected from the group of slots 86. It is therefore possible to minimize the gap between the surface of the diaphragm and the flat end surface of the voice coil cap due to the tolerance in the length of the voice coil bobbin and the tolerance in the position at which the damper is attached to the voice coil bobbin. It is thereby possible to prevent any abnormal noise such as buzzing caused by such a gap, thereby realizing a speaker improved in reliability and having good acoustic characteristics.

What is claimed is:

1. A speaker of the direct radiator-type comprising:
- an enclosure having a front side with a front opening and a rear side with a rear opening, the enclosure additionally having height, width, and thickness dimensions, with the thickness dimension being substantially smaller than the height dimension and the width dimension;
- a rigid diaphragm connected to the enclosure at the front opening, the diaphragm having a rear surface;
- at least one voice coil unit connected to the diaphragm, the at least one voice coil unit including
  - a cylindrical ring having first and second ends, a cylindrical wall, a plurality of projections on the cylindrical wall, and a flat end portion formed at the first end, the flat end portion of the cylindrical ring being fixed to the diaphragm, and
  - a voice coil bobbin having an end and having a plurality of groups of slots of different depths formed at the end of the voice coil bobbin, the projections being inserted into and fixed to one of the groups of slots to mater the end of said voice coil bobbin with the second end of said cylindrical ring, the voice coil bobbin being adapted for driving the diaphragm through the cylindrical ring; and
- means for partitioning the enclosure to provide a closed enclosure portion and an open enclosure portion which communications with the rear opening, part of the diaphragm being exposed to the closed enclosure portion and another part of the diaphragm being exposed to the open enclosure portion, the area of the part of the diaphragm that is exposed to the closed enclosure portion being approximately equal to the area of the another part of the diaphragm that is exposed to the open enclosure portion,
- wherein sound from the rear surface of the diaphragm is radiated toward the front of the enclosure through the rear opening.

2. A speaker according to claim 1, further comprising an acoustic duct, wherein the sound that is radiated from the rear surface of the diaphragm toward the front of the enclosure passes through the acoustic duct.

3. A speaker according to claim 2, wherein the sectional area of the acoustic duct gradually increases along at least a portion of the acoustic duct.

4. A speaker according to claim 2, wherein a plate is fixed to the enclosure adjacent the rear side of the enclosure.

5. A speaker according to claim 1, wherein the means for partitioning comprises means connected to the rear side of the enclosure for providing a tunnel to the rear opening.

6. A speaker according to claim 1, wherein a plurality of voice coil units for driving the diaphragm at a plurality of points are connected to the diaphragm, and wherein the driving force for each of the voice coil units is weighted.

7. A speaker according to claim 1, wherein the at least one voice coil unit is fixed to the diaphragm at a position where vibrations of both a primary free resonance mode and a secondary free resonance mode are restrained.

8. A speaker according to claim 1, wherein the rear side of the enclosure has an outer peripheral edge, wherein the rear opening has a peripheral edge, wherein the enclosure is mounted adjacent a wall so that the rear side of the enclosure is spaced apart from the wall by a gap which is utilized as an acoustic duct, and wherein the peripheral edge of the rear opening and the outer peripheral edge of the rear side are curved smoothly.

9. A speaker of the direct radiator-type comprising:
- a thin enclosure having a front side with a front opening and a rear side with a rear opening;
- a rigid diaphragm connected to the enclosure at the front opening;
- means for partitioning the enclosure to provide a closed enclosure portion and an open enclosure portion which communicates with the rear opening, part of the diaphragm being exposed to the closed enclosure portion and another part of said diaphragm being exposed to the opening enclosure portion;
- at least one coil unit to drive the part of the diaphragm that is exposed to the close enclosure portion; and at least one further voice coil unit to drive the another part of the diaphragm that is exposed to the closed enclosure portion, wherein the driving force per unit area $N_C/S_C$ is set to be larger than the driving force per unit are $N_O/S_O$, where $N_C$ represents the total driving force of the at least one voice coil unit that drives the part of the diaphragm exposed to the closed enclosure portion, $S_C$ represents the area of the part of the diaphragm exposed to said closed enclosure portion, $N_O$ represents the total driving force of the at least one further voice coil unit that drives the part of the diaphragm exposed to the open enclosure portion, and $S_O$ represents the area of the part of the diaphragm exposed to the open enclosure portion.

10. A speaker according to claim 9, further comprising means for providing a duct through which sound passing through the rear opening of the enclosure is radiated toward the front of the enclosure.

* * * * *